United States Patent [19]

McMahon et al.

[11] 4,029,853

[45] June 14, 1977

[54] PBS-AL SELECTIVE SOLAR ABSORBER

[75] Inventors: Thomas J. McMahon; Arold K. Green, both of Ridgecrest, Calif.

[73] Assignee: The United States of America as represented by the Secretary of the Navy, Washington, D.C.

[22] Filed: June 20, 1975

[21] Appl. No.: 588,914

[52] U.S. Cl. .................... 428/621; 126/270; 428/469

[51] Int. Cl.$^2$ ........................... B32B 15/20

[58] Field of Search ......... 29/195 Y, 197; 126/270, 126/271; 428/469

[56] References Cited

UNITED STATES PATENTS

| | | | |
|---|---|---|---|
| 3,176,678 | 4/1965 | Langley | 126/270 |
| 3,176,679 | 4/1965 | Langley | 126/270 |
| 3,272,986 | 9/1966 | Schmidt | 126/270 X |
| 3,374,830 | 3/1968 | O'Sullivan | 126/270 X |
| 3,716,424 | 2/1973 | Schoolar | 148/175 |
| 3,920,413 | 11/1975 | Lowery | 29/197 |

OTHER PUBLICATIONS

F. Daniels, "Direct Use of the Sun's Energy," Yale University Press, 1964, pp. 221–222.

Primary Examiner—L. Dewayne Rutledge
Assistant Examiner—E. L. Weise
Attorney, Agent, or Firm—R. S. Sciascia; Roy Miller; Lloyd E. K. Pohl

[57] ABSTRACT

A solar absorber comprising a 1000 to 1500 A thick layer of lead sulfide on a thermally conductive base. The solar absorber reflects on the order of 97% of the infrared while absorbing between 90 and 95% of the solar radiation band.

2 Claims, 2 Drawing Figures

PBS-AL SELECTIVE SOLAR ABSORBER

BACKGROUND OF THE INVENTION

1. Field of the Invention

This invention relates to solar absorbers. More particularly, this invention relates to panels or collectors which will absorb heat from the sun and retain it until it is removed by suitable means for use in any of a large variety of ways.

2. Description of the Prior Art

It is well known that solar radiation can be collected by flat plates of metal such as iron, copper or aluminum coated with a black coating. The coating on such a collector is designed to absorb as much of the solar radiation band (wavelengths between about 0.3 and 2.5 $\mu$) as possible and reflect as much infrared (wavelengths greater than 4 $\mu$) as possible.

One coating which has been experimented with in the prior art is a coating made up of about 0.1 $\mu$ diameter particles of lead sulfide embedded in a matrix of silicone. Such a coating is described in *Direct Use of the Sun's Energy*, Daniels, Yale University Press, 1964, pp. 209–224. It is reported that such a coating reflects about 10% of the solar radiation band (wavelengths below 2 $\mu$) and reflects about 80% of the infrared rays. Therefore, such a coating absorbs about 90% (100%-10%) of the solar radiation band and about 20% (100%-80%) of the infrared. While such figures are admirable, they (particularly the infrared reflectance) do not indicate that such a coating would be suitable for use in a solar absorber. It is desirable to reflect much more (100% if possible) of the infrared and absorb much more (again 100% if possible) of the solar radiation band.

SUMMARY OF THE INVENTION

It has now been found that when a 1000 to 1500 A (0.1 to .15 $\mu$) thick coating or layer of lead sulfide is deposited on a thermally conductive substrate, the result is a solar absorber which reflects on the order of 97% of the infrared radiation and absorbs from 90 to 95% of the solar radiation band. The thermally conductive substrate may be either highly polished aluminum or some other thermally conductive material such as copper having a coating of aluminum at least 500 A (.05 $\mu$) thick on it between it and the lead sulfide.

DESCRIPTION OF THE PREFERRED EMBODIMENTS

In practicing this invention, it is preferable to use vacuum deposition techniques. Vacuum deposition is one way in which the control necessary to achieve the critical thickness of lead sulfide may be readily achieved. Also, if a coating of aluminum on copper or some other thermally conductive material is used as the base upon which the lead sulfide is deposited, vacuum deposition offers a convenient way by which control necessary to achieve the desired aluminum thicknesses can be achieved. However, vacuum deposition is a well known art which can readily be practiced by any capable technician and need not be described in detail here.

Figure 1:
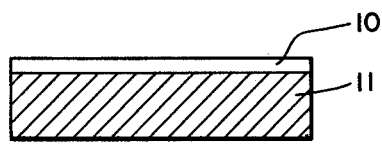
FIG. 1 is a cross-sectional view of a polished aluminum substrate with a coat of lead sulfide on it.
Figure 2:
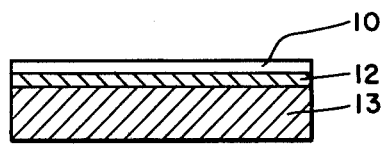
FIG. 2 is a cross-sectional view of a thermally conductive substrate with a coating of aluminum on it and a coating of lead sulfide on the aluminum coating.

Going now to the drawing, FIG. 1 depicts, in cross section, one embodiment of the invention. In this embodiment, a lead sulfide coating 10 is shown on an aluminum substrate 11. In FIG. 2, a second embodiment of the invention, a lead sulfide layer is shown upon an aluminum layer 12 which is, in turn, deposited on another thermally conductive substrate 13. The substrate 13 may be different than layer 12, i.e., copper or the like, or the same as layer 12. That is, substrate 12 may be aluminum.

In the embodiment shown in FIG. 1, the aluminum substrate 11 may be of any thickness. Experiments, however, have shown that in order to achieve a very high reflectance of infrared the lead sulfide coat should be between 1000 and 1500 A thick.

In the embodiment shown in FIG. 2, the thickness of substrate 13 is immaterial, the thickness of the lead sulfide layer 10 should again be in the range of from 1000 to 1500 A and the thickness of the aluminum layer 12 should be at least 500 A. There is no maximum permissible thickness for layer 12 just as there is no maximum for layer 13 (or 11- other than that dictated by practicality). Efficient power generation requires panels, i.e., solar absorbers or solar thermal collectors, that absorb strongly, in the solar spectral region while emitting very weakly at operating temperatures that may be as high as 573° K. The performance of such a panel may be conveniently characterized by the quantity $a$, the fraction of solar power at sea level absorbed by the panel, and the ratio $a/e$ where $e$ is the ratio of power emitted by the panel to the power emitted by a blackbody at the same temperature. Thus, a large value of $a/e$ as well as a value of $a \simeq 1$ are necessary for efficient power generation.

In experiments, the inventors found that panels fabricated by vacuum depositing a 1000 to 1500 A thick coating of lead sulifide on an aluminum surface exhibit values of $a \simeq 1$. They further found that, at room temperature without benefit of antireflection coatings, $a/e$ values of from 43 to 60 were obtained if the aluminum substrate had a thin layer of aluminum deposited on it prior to depositing the layer of lead sulfide. When polished aluminum without a deposited layer of aluminum was tested as the substrate, $a/e$ values were approximately 50% of those obtained in the above case, i.e., still excellent.

In fabricating panels containing an aluminum substrate without benefit of a deposited layer of aluminum, lead sulfide was deposited, in a standard vacuum system by standard vacuum evaporation depositing techinques, on polished aluminum substrates which were at room temperature during deposition. Where a deposited layer of aluminum was used as the surface, it was deposited in a standard vacuum system ($\simeq 10^{-6}$ Torr) on a thermally conductive base (such as Al, Cu, etc.) and then the lead sulfide layer was vacuum deposited on the aluminum surface as above.

In the cases where deposited aluminum layers were used, it was found that a thickness of at least 500 A was preferable. It was also found that it was preferable that the lead sulfide layer (with or without an underlying layer of deposited aluminum) be from 1000 to 1500 A thick. The polycrystalline lead sulfide had a grain size in the range of from $10^{-4}$ to $5 \times 10^{-4}$ cm.

Tests revealed the absorptance in the solar region for 1000 to 1500 A thick layers of lead sulfide to be about 95%. This high value is believed to result from the favorable optical properties of lead sulfide and from the morphology (surface structure and grain size) of the film. When a deposited layer of aluminum was used, emittances of only about 0.015 to 0.022 were observed. When no deposited layer of aluminum was used, i.e., when the substrate was simply polished aluminum rather than polished aluminum or some other thermally conductive material with a deposited layer of aluminum, emittances were somewhat higher but still low enough to be of value.

While lead sulfide was deposited on aluminum by vacuum deposition techniques in making panels upon which tests leading to this invention were made, it will be obvious to those skilled in the art that other methods could be used. For example, sputtering techniques could be used. Also, any other method which would yield a similar coat of lead sulfide on an aluminum surface could be used. Tests, in addition to showing that lead sulfide had a high absorption in the solar radiation band and low emittance in the infrared, showed that the lead sulfide collector surface was stable in vacuum, i.e., did not decompose or was not otherwise deleteriously effected, over a wide range of temperatures including the typical operating temperature of about 573° K ($\sim$ 300° C). Further, both aluminum and lead sulfide are inexpensive, readily available materials and, in addition, deposition techniques whereby aluminum layers can be deposited on a thermally conductive substrate or an aluminum substrate and whereby lead sulfide can be deposited on the aluminum surface, are well know, inexpensive and adaptable to mass production.

What is claimed is:

1. As an article of manufacture a solar energy collection panel for solar absorbing purposes comprising:
    A. A thermally conductive plate of aluminum; and
    B. A vacuum deposited coating of lead sulfide on one exterior surface of said thermally conductive plate, said lead sulfide coating being from 1000 to 1500 A thick.
2. An article of manufacture according to claim 1 wherein said thermally conductive plate consists essentially of any suitable thermally conductive plate having a layer of vacuum deposited aluminum at least 500 A thick on one surface and wherein said lead sulfide coating is on the layer of vacuum deposited aluminum.

* * * * *